United States Patent
Azad et al.

(10) Patent No.: US 11,581,881 B1
(45) Date of Patent: Feb. 14, 2023

(54) CLOCK AND PHASE ALIGNMENT BETWEEN PHYSICAL LAYERS AND CONTROLLER

(71) Applicant: XILINX, INC., San Jose, CA (US)

(72) Inventors: Sarosh I. Azad, Fremont, CA (US); Benson Chau, Sunnyvale, CA (US); Tomai Knopp, San Jose, CA (US)

(73) Assignee: XILINX, INC., San Jose, CA (US)

( * ) Notice: Subject to any disclaimer, the term of this patent is extended or adjusted under 35 U.S.C. 154(b) by 7 days.

(21) Appl. No.: 17/405,854

(22) Filed: Aug. 18, 2021

(51) Int. Cl.
| | |
|---|---|
| *H03K 5/02* | (2006.01) |
| *H03K 23/60* | (2006.01) |
| *H03K 19/20* | (2006.01) |
| *H03K 19/173* | (2006.01) |
| *H03K 5/00* | (2006.01) |

(52) U.S. Cl.
CPC ......... *H03K 5/023* (2013.01); *H03K 19/1737* (2013.01); *H03K 19/20* (2013.01); *H03K 23/60* (2013.01); *H03K 2005/00286* (2013.01)

(58) Field of Classification Search
None
See application file for complete search history.

(56) References Cited

U.S. PATENT DOCUMENTS

| | | |
|---|---|---|
| 6,906,562 B1 | 6/2005 | Nguyen |
| 7,307,460 B2 | 12/2007 | Robinson et al. |
| 7,885,320 B1 | 2/2011 | Groen et al. |
| 8,358,553 B2 | 1/2013 | Schultz et al. |
| 8,650,429 B1 * | 2/2014 | Starr ................ H03K 19/01837 713/400 |
| 9,148,192 B1 | 9/2015 | Wong et al. |
| 11,411,560 B1 * | 8/2022 | Yu .................. H03K 19/017509 |
| 2014/0047158 A1 * | 2/2014 | Frans .................... G06F 3/0659 711/102 |
| 2018/0101502 A1 * | 4/2018 | Nassif ................... G06F 9/5038 |
| 2019/0354134 A1 * | 11/2019 | Cali ......................... G06F 1/12 |

* cited by examiner

*Primary Examiner* — Jany Richardson
(74) *Attorney, Agent, or Firm* — Patterson + Sheridan, LLP

(57) ABSTRACT

An integrated circuit (IC) for clock and phase aligning and synchronization between physical (PHY) layers and a communications controller is provided. The IC includes a clock multiplier configured to multiply a frequency of the clock signal from a plurality of PHY layers to match a frequency of a clock signal of the controller, wherein the clock signal from the plurality of PHY layers is less than the frequency of the clock signal of the controller. IC support circuitry is configured to provide the multiplied clock signal to the controller. The IC includes a first clock divider configured to divide the frequency of the multiplied clock signal and to output the divided clock signal to the controller. The IC includes a phase alignment circuit configured to align phases of one or more data signals based on a phase of the clock signal and a phase of the multiplied clock signal.

20 Claims, 5 Drawing Sheets

CLOCK AND PHASE ALIGNMENT BETWEEN PHYSICAL LAYERS AND CONTROLLER

TECHNICAL FIELD

Examples of the present disclosure generally relate to clock and phase alignment and, in particular, to aligning clock signals and phase between physical layers and controllers.

BACKGROUND

Performance in some communication protocol solutions can be doubled based on the number of physical (PHY) layers used. To achieve the increase in performance, the physical layer is required to support twice as many channels, and the communication protocol controller is required to increase its performance correspondingly. The changes and corresponding redesign of the physical layer is needed because some physical layers do not have enough channels needed to support the increase in performance and can only provide a clock signal that correspond to their own performance level. Changes to the design of the physical layer requires changes at the silicon level to support the higher maximum frequency. However, redesigning the physical layer can be cost-prohibitive due to other business demands, so a different technical solution is desired.

Redesigning data paths of a communications protocol controller in order to double its width to keep up with doubling of channels requires additional complexity of processing twice as many packets on the same cycle with ordering interdependencies and opens up a new set of design, verification, and/or validation risks.

Some solutions can involve using two instances of physical layers that are each half of the number of channels needed to get the total number of channels. For example, some solutions can use two physical layers that are each eight channels wide in order to achieve the total 16 channels needed. However, this requires synchronization across 16 channels.

Another solution can involve doubling the clock frequency of the data path between the physical layers and the communications protocol controller. For such solutions, the communications protocol controller also needs to double the clock frequency without physically modifying the physical layer. Accordingly, an alternate clock source is needed for the synchronization between the communications protocol controller and the physical layers.

SUMMARY

Examples of the present disclosure generally relate to clocking and phase alignment and synchronization between physical layers of an integrated circuit and a communications protocol controller of the integrated circuit.

One example of the present disclosure is an integrated circuit. The integrated circuit includes a clock multiplier configured to multiply a frequency of a clock signal from a plurality of physical (PHY) layers to match a frequency of a clock signal of a communications controller, wherein the frequency of the clock signal from the one or more PHY layers is less than the frequency of the clock signal of the communications controller. The integrated circuit includes support circuitry configured to provide the multiplied clock signal to the communications controller. The integrated circuit includes a first clock divider configured to divide the frequency of the multiplied clock signal and to output the divided clock signal to the communications controller. The integrated circuit includes a phase alignment circuit configured align phases of one or more data signals based on a phase of the clock signal from the PHY layers and a phase of the multiplied clock signal.

Another example is a method for synchronizing a plurality of PHY layers with a communication controller. The method includes receiving a clock signal from the plurality of PHY layers, wherein a frequency of the clock signal from the plurality of PHY layers does not match a frequency of a clock signal of the communication controller. The method includes multiplying the frequency of the clock signal from the PHY layers to match the frequency of the clock signal of the communication controller. The method includes aligning a phase of one or more data signals between the plurality of PHY layers and the communication controller based on the multiplied clock signal and the clock signal.

Another example is an integrated circuit including a plurality of PHY layers, each having a first clock signal with a first frequency and having a first plurality of channels. The integrated circuit includes a communications controller having a second clock signal with a second frequency and having a second plurality of channels, wherein the second frequency of the second clock signal is greater than the first frequency of the first clock signal and a total number of channels of the plurality of PHY layers matches the second plurality of channels. The integrated circuit includes a clock multiplier configured to multiply the first frequency of the first clock signal to match the second frequency of the second clock signal to emulate a faster clock communication link between the plurality of PHY layers and the communications controller.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
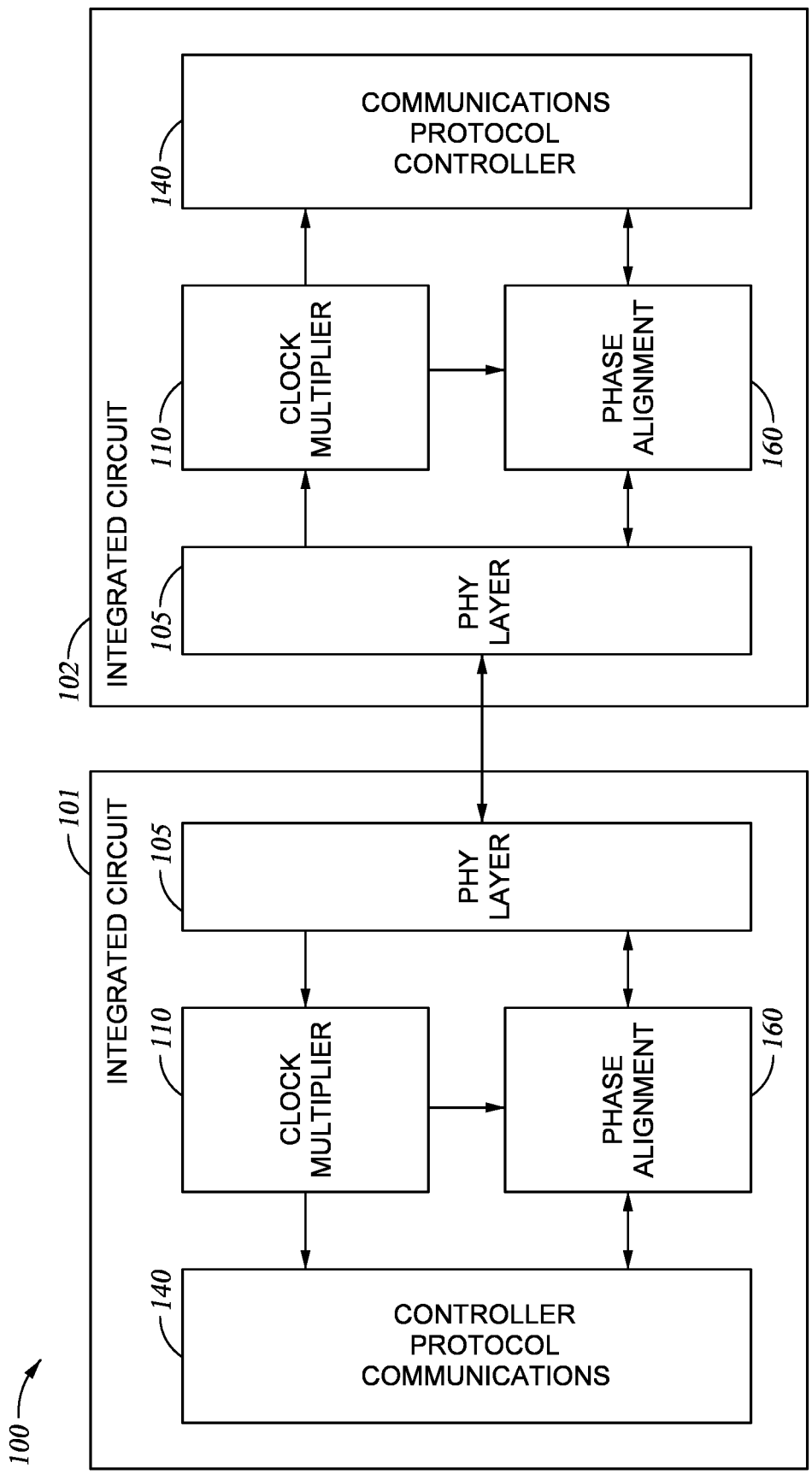
FIG. 1 is a block diagram of a communications system, according to some example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe an integrated circuit for clock and phase alignment between physical layers and a communications protocol controller. The examples of the integrated circuit are configured to multiply the clock frequency to produce the clock frequency required by the communications protocol controller, and to compensate for frequency and phase differences. Also, in some examples, the integrated circuit unifies phase synchronization across all channels to ensure compliance with the communications protocol.

The examples herein described saves the cost of design changes in the physical (PHY) layers of the integrated circuit while avoiding making logic level changes in the communications protocol controller. The combination also maintains compliance with the communications protocol specification and low latency.

FIG. 1 is a block diagram of a communications system according to one example. The communications system 100 includes a first integrated circuit 101 and a second integrated circuit 102. Each of the integrated circuits 101 and 102 includes a PHY layer 105, a communications protocol controller 140, a clock multiplier 110, and a phase alignment circuit 160. References to components of one of the integrated circuits 101 and 102 can also apply to the other of the integrated circuits 101 and 102.

In each of the integrated circuits 101 and 102, the PHY layer 105 is coupled to the clock multiplier 110 and to the phase alignment circuit 160. The clock multiplier 110 receives a clock signal from the PHY layer 105 and sends a multiplied clock signal to the communications protocol controller 140. The clock multiplier 110 also sends a divided clock signal to the phase alignment circuit 160. The phase alignment circuit 160 receives the divided clock signal from the clock multiplier 110 and a clock signal from the PHY layer 105. The phase alignment circuit 160 is also communicatively coupled to the PHY layer 105 and the communications protocol controller 140, and sends and receives signals to and from the PHY layer 105 and the communications protocol controller 140.

According to some examples, the PHY layer 105 can include any number of PHY layers. The PHY layer 105 can include any number of communication channels and can have a predetermined maximum frequency for a clock signal of the PHY layer 105. In some examples, the PHY layer 105 is configured to transmit and receive signals using a link with an external computing system, such as a communications protocol layer having the communications protocol controller 140. For example, PHY layer 105 of the integrated circuit 101 is configured to transmit and receive signals from the PHY layer 105 of the integrated circuit 102 using a communications protocol such as PCIe. The PHY layer 105 can include any number of physical layer circuits, such as transceivers configured to send and receive data streams, CMTs, global clock buffers, global clock multiplexing structures, and I/O logic management functions. In some examples, the PHY layer 105 can be serializer/deserializer (SerDes) technology that meets certain requirements detailed herein. The term "layer" in this context refers to a single kind of communication channel with its own data and specifications.

The communications protocol controller 140 can include any number of interfaces that provide connectivity between the integrated circuit 101 and any number of peripheral components. The communications protocol controller 140 may include any plurality of peripheral interconnect express (PCIe) interfaces and interfaces for any cache coherent protocol, such as cache coherent interconnect for accelerators (CCIX), that provide connectivity to other devices or chips via the PHY layer 105. The communications protocol controller 140 is configured to process communications at the PHY layer, based on the communications protocol used by the communications protocol controller 140, and operates at a predetermined frequency. The communications protocol controller 140 can include any number of communication channels and can have a predetermined maximum frequency for a clock signal. In some examples, the communications protocol controller 140 has double the number of communication channels as the PHY layer 105 and the predetermined maximum frequency for a clock signal of the communications protocol controller 140 is double that of the predetermined maximum frequency of the PHY layer 105. The number of communication channels of the communications protocol controller 140 and the predetermined maximum frequency for the clock signal of the communications protocol controller 140 is a factor larger (e.g., two times, four times) than those of the PHY layer 105.

According to some examples, the clock multiplier 110 is configured to multiply the frequency of the clock signal of the PHY layer 105 by a factor to match the frequency of the clock signal for the communications protocol controller 140. For example, the communications protocol controller 140 is configured to receive a clock signal with a frequency of 2 GHz and to send and receive data signals across 16 channels, while the PHY layer 105 includes two physical layers each having a clock signal with a frequency of 1 GHz and each configured to send and receive data signals across 8 channels respectively. Because of the mismatch of frequencies of the clock signal between the PHY layer 105 and the communications protocol controller 140, the clock multiplier 110 can be configured to multiply the clock signal of the PHY layer 105 to match the clock signal of the communications protocol controller 140. In some examples, the clock multiplier 110 is configured to receive the clock signal from the PHY layer 105 and is configured to generate another clock signal having a frequency multiplied by a predetermined factor in order to match the clock signal frequency of the communications protocol controller 140. Accordingly, the clock multiplier 110 outputs the generated clock signal to the communications protocol controller 140.

The phase alignment circuit 160 is configured to synchronize phases across all channels of the PHY layer 105 and the communications protocol controller 140 to ensure compliance with the communications protocol (e.g., PCIe, CCIX, Compute Express Link (CXL)). In some examples, the phase alignment circuit 160 receives the multiplied clock signal from the clock multiplier 110 and the clock signal from the PHY layer 105, and compares the phases of the two clock signals to get the phase alignment that corrects for different phases between the two clock signals. With the phase alignment that corrects for the different phases between the two clock signals, the phase alignment circuit 160 can send and receive data signals to and from the PHY layer 105 and the communications protocol controller 140 and can synchronize the data signals between the PHY layer 105 and the communications protocol controller 140 based on the phase alignment that corrects for the different phases between the two clock signals.

According to some examples, the clock multiplier 110 and the phase alignment circuit 160 produces the required clock signal for the communications protocol controller 140, compensates for frequency and phase differences by using clock division and phase synchronizations techniques, and also unifies phase synchronization across all channels to ensure compliance with the communications protocol of the communications protocol controller 140.

Figure 2:
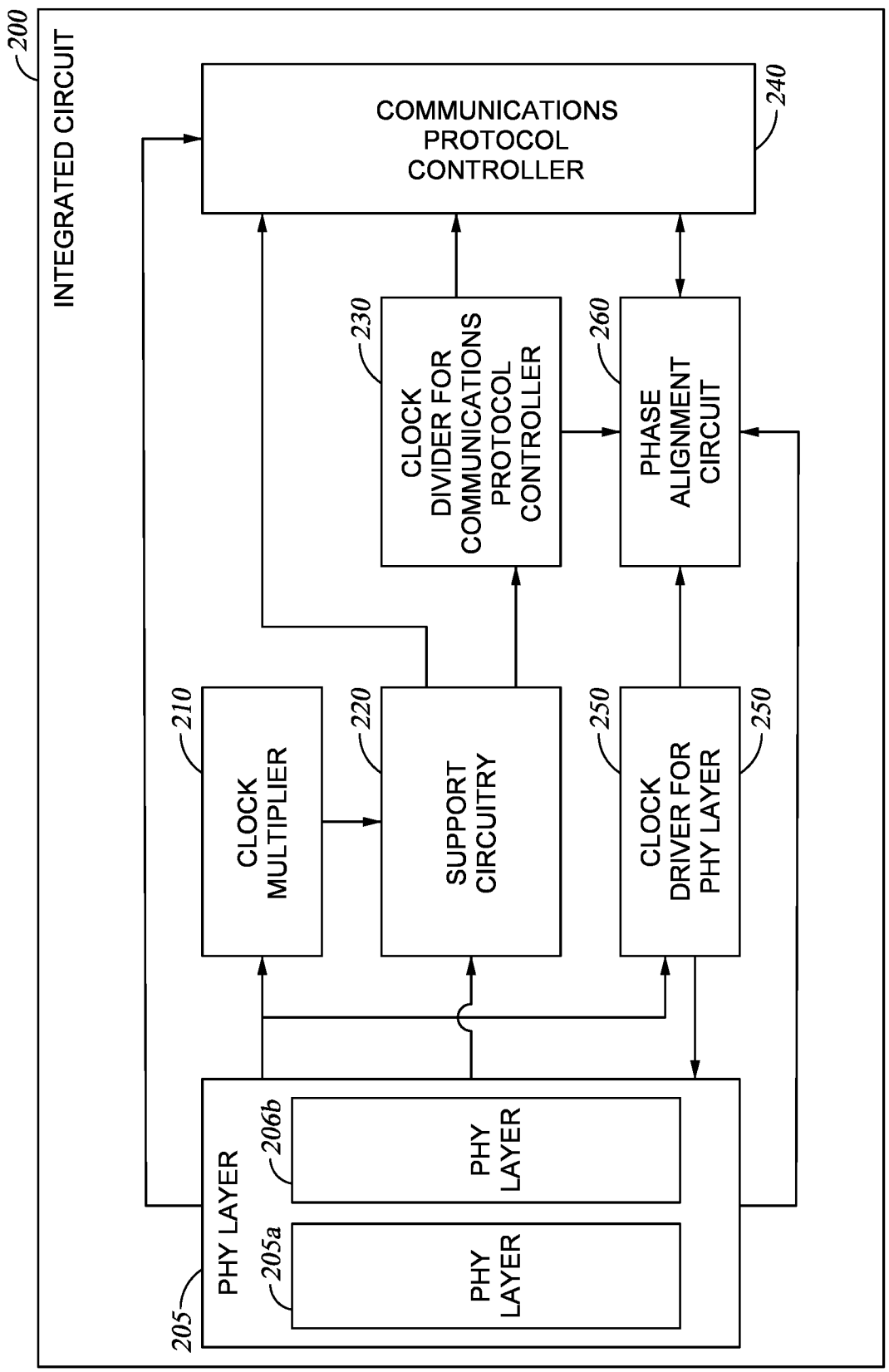
FIG. 2 is a block diagram of an integrated circuit, according to some example.

FIG. 2 is a block diagram of an integrated circuit, according to one example. The integrated circuit 200 is another example of the integrated circuits 101 and 102 of FIG. 1. The integrated circuit 200 includes a PHY layer 205, a communications protocol controller 240, a clock multiplier 210, support circuitry 220, a clock divider 230 for the communications protocol controller, a clock divider 250 for the PHY layer, and a phase alignment circuit 260.

As illustrated in FIG. 2, the PHY layer 205 is coupled to the communications protocol controller 240, to the clock multiplier 210, to the support circuitry 220, to the clock divider 250 for the PHY layer, and to the phase alignment circuitry 260. The PHY layer 205 in FIG. 2 can be the PHY layer 105 of FIG. 1 and is configured to transmit and receive signals using a link with an external computing system (not illustrated), such as a communications protocol layer, which can include a communications protocol controller 240. In some examples, the PHY layer 205 includes a first PHY layer 205a and a second PHY layer 205b. The first PHY layer 205a and the second PHY layer 205b can be gigabit transceivers, such as Gen5×8 gigabit transceivers or Gen5×16 gigabit transceivers. In some examples, the PHY layer 205 can be used to operate according to instructions sent from the communications protocol controller 240 (e.g., a PCIe controller).

In some examples, the second PHY layer 205b can be used to provide additional channels while inheriting the clocking and phase alignment for the first PHY layer 205a thereby doubling the number of channels.

The clock multiplier 110 is coupled to the PHY layer 205 and to the support circuitry 220. The clock multiplier 210 in FIG. 2 can be the clock multiplier 110 of FIG. 1 and is configured to multiply the frequency of the clock signal from the PHY layer 205 to match the frequency of the clock signal of the communications protocol controller 240. The clock multiplier 210 can include any number of circuit components needed in order to either multiply the frequency of the clock signal from the PHY layer or to generate a clock signal with a frequency that matches the frequency of the clock signal of the communications protocol controller 240.

The support circuitry 220 is coupled to the PHY layer 205, to the clock multiplier 210, to the communications protocol controller 240, and to the clock divider 230 for the communications protocol controller. The support circuitry 220 is configured to direct signals to various components of the integrated circuit 200, and is configured to select between the clock signals to send to the communications protocol controller 240. The support circuitry 220 can include any number of circuit components, such as multiplexers, AND gates, and other logic gates.

The clock divider 230 for the communications protocol controller is coupled to support circuitry 220, to the communications protocol controller 240, and to the phase alignment circuit 260. In some examples, the clock divider 230 for the communications protocol controller can include circuit components, such as multiplexers and other logic gates. The clock divider 230 for the communications protocol controller, as mentioned previously, is configured to divide the multiplied clock signal from the clock multiplier 210 in order to generate multiple instances of the original clock signal from the PHY layer 205 to output to the communications protocol controller 240. In some examples, the clock divider 230 for the communications protocol controller can be a part of the clock multiplier 210. For example, the clock divider 230 for the communications protocol controller may be disposed in the clock multiplier 210 of FIG. 2.

The clock divider 250 for PHY layer is coupled to the PHY layer 205 and to the phase alignment circuit 260. The clock divider 250 for the PHY layer is configured to divide the clock signal from the PHY layer 205. In some examples, the clock divider 250 can generate a clock signal with a frequency equal to the frequency of the clock signal from the PHY layer divided by a predetermined factor. The predetermined factor can be based on the divided reference signal from the clock divider 230 for the communications protocol controller. For example, the generated/divided clock signal has a frequency that matches the frequency of the divided reference signal from the clock divider 230 for the communications protocol controller. In some examples, the clock divider 250 for the PHY layer can include circuit components, such as multiplexers and other logic gates.

The phase alignment circuit 260 is coupled to the clock divider 250 for PHY layer, to the clock divider 230 for the communications protocol controller, and to the communications protocol controller 240. The phase alignment circuit 260 of FIG. 2 can be the same as the phase alignment circuit 160 of FIG. 1 and is configured to receive clock signals from the PHY layer 205 and the communications protocol controller 240 and to correct the phases of the clock signals. In some examples, the phase alignment circuit 260 can be a first-in-first-out (FIFO) queue. The use of a FIFO allows for the transfer of the data path from the clock domain of the divided reference clock signal to the clock domain of the divided clock signal and, similarly, for the transfer of the data path from the clock domain of the divided clock signal to the clock domain of the divided reference clock signal. In some examples, the use of a FIFO for the phase alignment circuit 260 across all channels does not introduce skew across channels. Otherwise, the integrated circuit 200 violates the specification for communications protocol (e.g., PCIe) for transmission skew.

The communications protocol controller 240 is coupled to the PHY layer 205, to the clock divider 230 for communications protocol controller, and to the phase alignment circuit 260. The communications protocol controller 240 of FIG. 2 can be the communications protocol controller 140 of FIG. 1. The communications protocol controller can implement any communication protocol.

Figure 3:
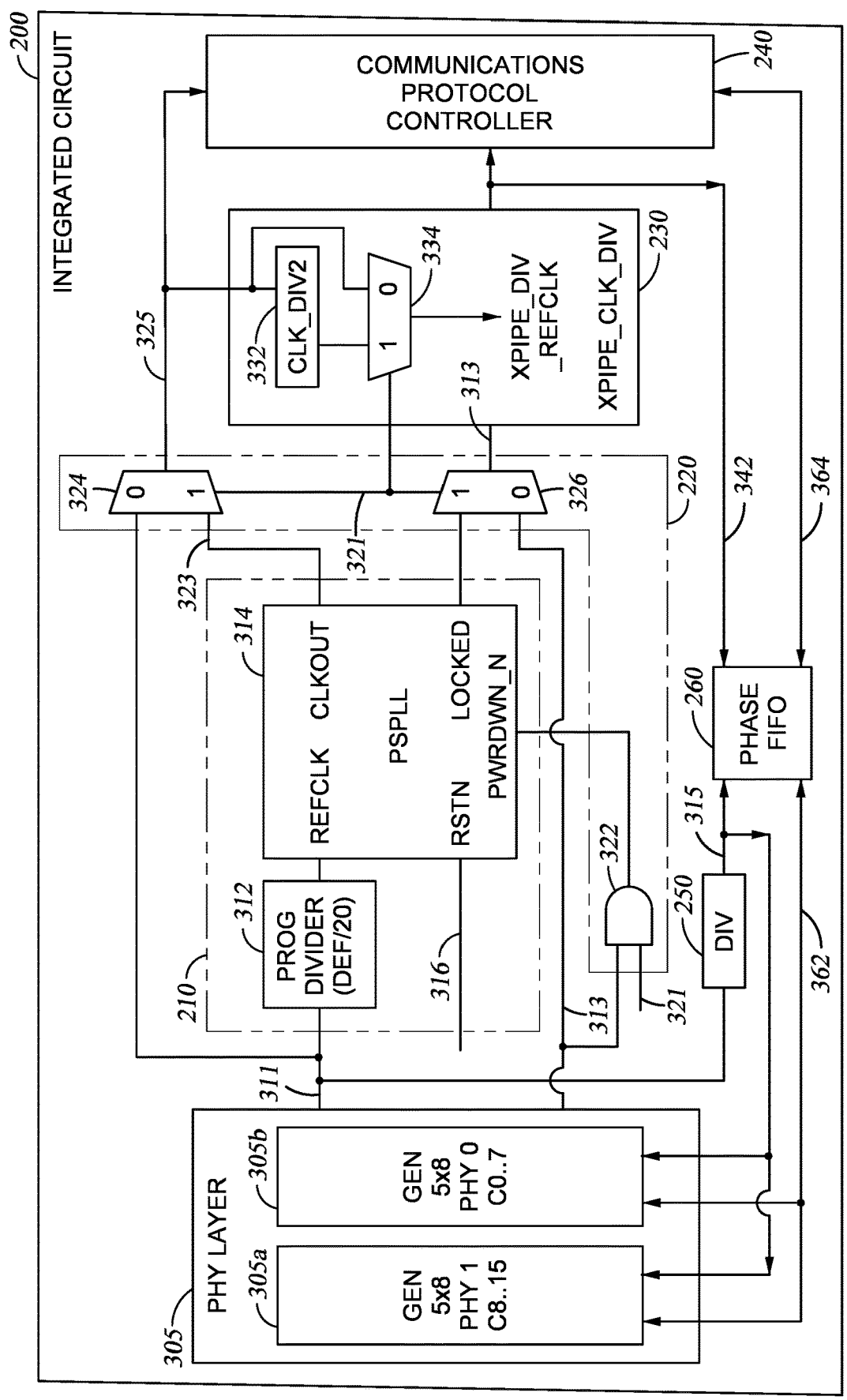
FIG. 3 depicts circuitry for doubling performance of the physical (PHY) layers, according to some example.

FIG. 3 depicts circuitry for doubling performance of the physical layers, according to one example. FIG. 3 shows an integrated circuit, similar to that of the integrated circuits 101 and 102 of FIG. 1 and the integrated circuit 200 of FIG. 2, and can perform the operations of doubling the clock frequency of the PHY layer and synchronizing phases of signals between the PHY layer and the communications protocol controller 340. The integrated circuit 300 includes a PHY layer 305, a clock multiplier 210, a communications protocol controller 240, support circuitry 220, a clock divider 230 for the communications protocol controller, a phase alignment circuit 260, and a clock divider 250 for the PHY layer.

The PHY layer 305, as mentioned previously with regards to FIGS. 1 and 2, is configured to transmit and receive signals using a link with an external computing system, such as a communications protocol layer. In some examples, the PHY layer 305 includes a first PHY layer 305a and a second PHY layer 305b. As illustrated, the first PHY layer 305a and the second PHY layer 305b can be gigabit transceivers, such as Gen5×8 gigabit transceivers or Gen5×16 gigabit transceivers. The PHY layer 305 outputs the maximum physical clock signal 311 (MAX_PCLK) with a frequency of 1 GHz, which is sent to the clock multiplier 210 and to the clock divider 250 for the PHY layer, and receives a divided version 315 of the outputted maximum physical clock signal. The first PHY layer 305a and the second PHY layer 305b can receive the divided version 315 of the outputted maximum physical clock signal. In some examples, as illustrated in FIG. 3, the PHY layer 305 sends data signals 362 to the phase alignment circuit 260 and receives phase-aligned data signals 362 from the phase alignment circuit 260. The PHY layer 305 also sends a physical ready signal 313 (phy_rdy) to support circuitry 220.

In some examples, the first PHY layer 305a provides the maximum physical clock signal 311 at 1 GHz, which can be the same frequency as a Gen 5×8 link gigabit transceiver.

As mentioned, the clock multiplier 210 is configured to multiply the frequency of the clock signal from the PHY layer 305 to match the frequency of the clock signal of the communications protocol controller 240. As illustrated, the clock multiplier 210 includes a program (PROG) divider 312 and a processing system (PS) phase-locked logic (PLL) circuit 314. The clock multiplier 210 receives the maximum physical clock signal 311 (MAX_PCLK) with a predetermined maximum clock frequency (e.g., 1 GHz), and in some examples, the maximum physical clock signal goes to the PROG divider 312 and the PROG divider 312 outputs to the PS PLL 314.

The PS PLL 314 includes multiple inputs and multiple outputs. One of the inputs of the PS PLL 314 is coupled to the output of the PROG divider 312, and another one of the inputs of the PS PLL 314 is a configuration signal 316 that indicates information for multiplying the frequency of the clock signal of the PHY layer 305. The outputs of the PS PLL 314 is coupled to the various circuit components of the support circuitry 220. One of the outputs of the PS PLL 314 is the multiplied clock signal 323 with a frequency equal to the frequency of the maximum physical clock signal multiplied by a factor indicated by the configuration signal 316 (e.g., por_rst_n). For example, the output of the PS PLL 314 of FIG. 3 is 2 GHz because the maximum physical clock signal from the PHY layer 305 is 1 GHz and the PS PLL 314 multiplies 1 GHz by a factor of 2. In some examples, the multiplying factor indicated in the configuration signal 316 can be based on the frequency required by the communications protocol controller 240. For example, the communications protocol controller 240 operates at 4 GHz and the clock frequency from the PHY layer is 1 GHz, and accordingly the PS PLL 314 multiplies the clock frequency from the PHY layer 305 by a factor of 4.

In some examples, the PS PLL 314 with the supporting PROG divider 312 is used to generate a zero parts per million (PPM) 2 GHz clock from a clock signal with a frequency of 1 GHz.

The support circuitry 220 is coupled to the clock multiplier 210, to the PHY layer 305, and to the clock divider 230 for the communications protocol controller. The support circuitry 220 is configured to send either the maximum physical clock signal 311 or the multiplied clock signal 323 to the communications protocol controller 240. The support circuitry 220 can include any number of AND gates, multiplexers, and other circuit components.

According to some examples, the support circuitry 220 can be provided by the multiplied clock signal 325 to the communications protocol controller 240 to run the fastest data paths between the PHY layer 305 and the communications protocol controller 240.

As illustrated in FIG. 3, the support circuitry 220 includes an AND gate 322, a first multiplexer 324, and a second multiplexer 326. The AND gate 322, the first multiplexer 324, and a second multiplexer 326 are each configured to receive at least one configuration signal 321 (e.g., gen5_x 16_cfg). The configuration signal 321 can indicate which clock signal (of the clock signal of the PHY layer 305 or the multiplied clock signal from the clock multiplier 210) goes to the communications protocol controller 240. The support circuitry 220 can pass one of the clock signals to the clock divider 230 of the communications protocol controller or to the communications protocol controller 240, based on the configuration signal. In some examples, the output of the AND gate 322 is coupled to an input port of the PS PLL 314 of the clock multiplier 210, and the input of the AND gate 322 includes the physical ready signal from the PHY layer 305 and the configuration signal 321.

In some examples, the first multiplexer 324 of the support circuitry 220 can be used to select the output of the PS PLL 314 when operating in dual PHY (e.g., Gen5×16) mode. In such examples, a single PHY layer (e.g., Gen 5×8) and lower modes of operation are allowed when the PS PLL 314 may be disabled to save power.

According to some examples, the clock divider 230 for the communications protocol controller is coupled to the support circuitry 220 and to the communications protocol controller 240. The clock divider 230 receives the output of the first multiplexer 324 (e.g., signal 325) and the output of the second multiplexer 326 (e.g., signal 313). In some examples, the clock divider 230 for the communications protocol controller includes a reference clock divider 332 and a multiplexer 334. The reference clock divider 332 receives the multiplied clock signal from the clock multiplier 310 by a predetermined factor. The configuration signal can be used as a selector for the multiplexer 334 for selecting one of the multiplied clock signals or the divided version of the multiplied clock signal. The output of the multiplexer 334 can then be used further dividing in order achieve the original clock signal from the PHY layer 305. In some examples, the use of the reference clock divider 332 and the multiplexer 334 is to cancel out the effects of the clock multiplier 210 and to revert back to the original clock signal from the PHY layer 305, so that the clock divider 230 can send multiple instances of the clock signal from the PHY layer 305 to the communications protocol controller 240.

In some examples, the divided clock signal 342 from the clock divider 230 for the communications protocol controller is based on the 2 GHz maximum physical clock signal that was multiplied by the clock multiplier 210. Accordingly, the divided clock signal from the clock divider has a deterministic phase relationship with the output of the PS PLL 214 of the clock multiplier 210. However, the divided clock signal from the clock divider 230 has no phase relationship with the 1 GHz maximum physical clock signal from the PHY layer 305. The divided clock signal cannot by connected to the PHY layer 305 (either the first PHY layer 305a or the second PHY layer 305b) because the PHY layer 305 performs delay alignment when the PHY layer 305 expects a turnaround of several nanoseconds and the PS PLL 314 has a phase shift turnaround of several hundred nanoseconds.

According to some examples, the integrated circuit 300 includes a clock divider 250 for the PHY layer. The clock divider 250 for the PHY layer receives the maximum physical clock signal from the PHY layer 305 and is configured to divide the maximum clock signal to match the divided clock signal from the clock divider 230 from the communications protocol controller. The output of the clock divider 250 goes to the phase alignment circuit 260 and to the PHY layer 305. In some examples, the output of the clock divider 250 also goes to the first PHY layer 305a and the second PHY layer 305b. Specifically, the clock divider 250 outputs a divided version of the clock signal to the PHY layer 305 and the phase alignment circuit 260.

In some examples, coupling the PHY layer 305 and the clock divider 250 for the PHY layer forms a loop with a several nanosecond turnaround for any phase adjustments coming out of the PHY layer 305 and allows the delay alignment of the PHY layer 305 to take place.

The phase alignment circuit 260 receives the divided reference signal from the clock divider 230 for the communications protocol controller 240 and receives the divided clock signal from the clock divider 250 for the PHY layer. Using the divided reference signal from clock divider 230 and the divided clock signal from the clock divider 250, the phase alignment circuit 260 determines any phase differences between the two divided signals. If the phase alignment circuit 260 determines that there are phase differences between the two divided signals, the phase alignment circuit 260 determines a phase alignment that corrects the differences in the phases between the two divided signals.

In some examples, the divided signals received by the phase alignment circuit 260 are the same frequency so that the phase alignment circuit 360 can determine any phase differences between the two divided signals.

Once the phase alignment circuit 360 has a phase alignment that corrects the differences in phases between the two divided signals, the phase alignment circuit 360 can use the phase alignment to synchronize the phases of any data signals 362, 364 to and from the PHY layer 305 and to and from the communications protocol controller 340. In some examples, the phase alignment circuit 360 can receive data signals 362 from the PHY layer 305, correct the phase of the data signals 362 using the phase alignment, and send the phase-corrected data signals 362 back to the PHY layer 305. Similarly, the phase alignment circuit 360 can receive data signals 364 from the communications protocol controller 340, correct the phase of the data signals 364 using the phase alignment and end the phase-corrected data signals 364 back to the communications protocol controller 340. In such examples, the phase alignment circuit 360 keeps the data signals 362 to and from the PHY layer 305 separate from the data signals 364 to and from the communications protocol controller 340. In other examples, the phase alignment circuit 360 can receive data signals 362 from the PHY layer 305, correct the phase of the data signals 362 using the phase alignment, and send the phase-corrected data signals 364 to the communications protocol controller 340.

Figure 4:
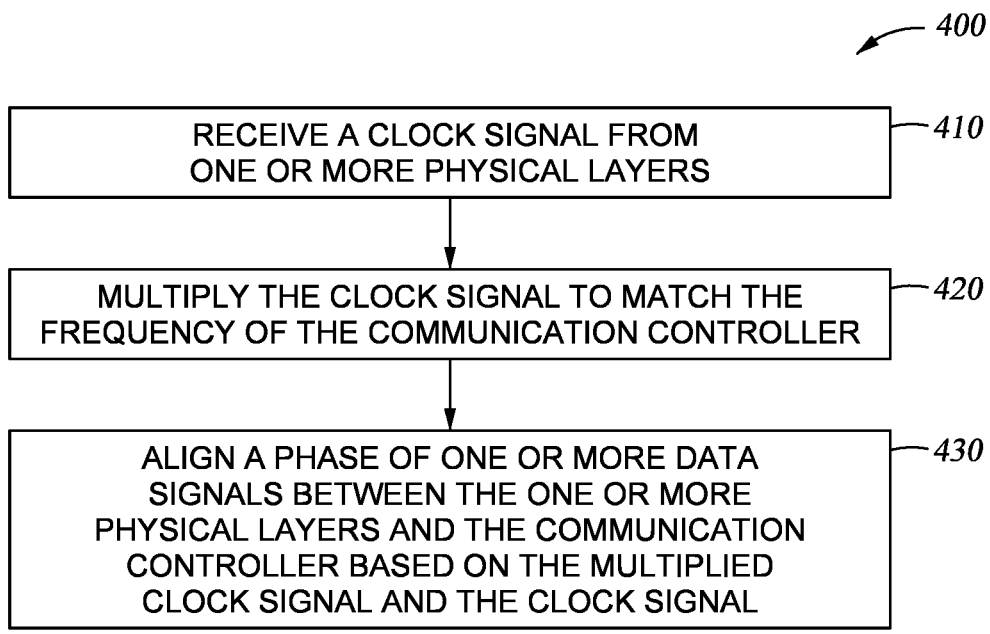
FIG. 4 is a flowchart of operations for doubling performance of the PHY layers for a communications protocol controller, according to some examples.

FIG. 4 is a flow diagram of example operations performed by an integrated circuit, according to some examples. Operations 400 may be performed by an integrated circuit, like the integrated circuits 101, 102 of FIG. 1, the integrated circuit 200 of FIG. 2, or the integrated circuit 300 of FIG. 3.

Operations 400 begin at block 410 with the integrated circuit receiving a clock signal from one or more physical layers. The frequency of the clock signal does not match a frequency of a communications controller disposed in the integrated circuit.

At block 420, operations 400 continue with the integrated circuit multiplying the clock signal to match the frequency of the communications protocol controller (e.g., communications protocol controller 140 of FIG. 1). In some examples, multiplying the clock signal to match the frequency of the communication controller includes multiplying the clock signal by a factor indicated in one or more configuration signals to match the frequency of the clock signal with the frequency of the communications protocol controller.

At block 430, operations 400 continue with the integrated circuits 101, 102 aligning a phase of one or more data signals between the one or more physical layers and the communication controller based on the multiplied clock signal and the clock signal. Aligning the phase of the one or more data signals can include dividing the multiplied clock signal based on a first factor indicated in one or more configuration signals into a first divided clock signal and dividing the clock signal based on a second factor indicated in the one or more configuration signals into a second divided clock signal. The integrated circuit, then, determines a phase alignment between the first divided clock signal and the second divided clock signal to align the phase of the one or more data signals.

In some examples, operations 400 further include dividing the clock signal based on a factor indicated by one or more configuration signals, and sending the divided clock signal to the PHY layers.

In some examples, operations 400 further include selecting one of the multiplied clock signal and the clock signal to send to the communications controller. Selecting one of the multiplied clock signal and the clock signal can be based on a configuration signal 321.

According to some examples, examples of the present disclosure use the techniques and circuitry described to double the frequency of the clock signal produced by the physical layers of the integrated circuit. The techniques and circuitry described herein compensate for frequency and phase differences by using clock division and phase synchronization techniques. Also, the techniques and circuitry described herein unify phase synchronization across all channels to ensure compliance with the communications protocol being used for the integrated circuit.

Figure 5:
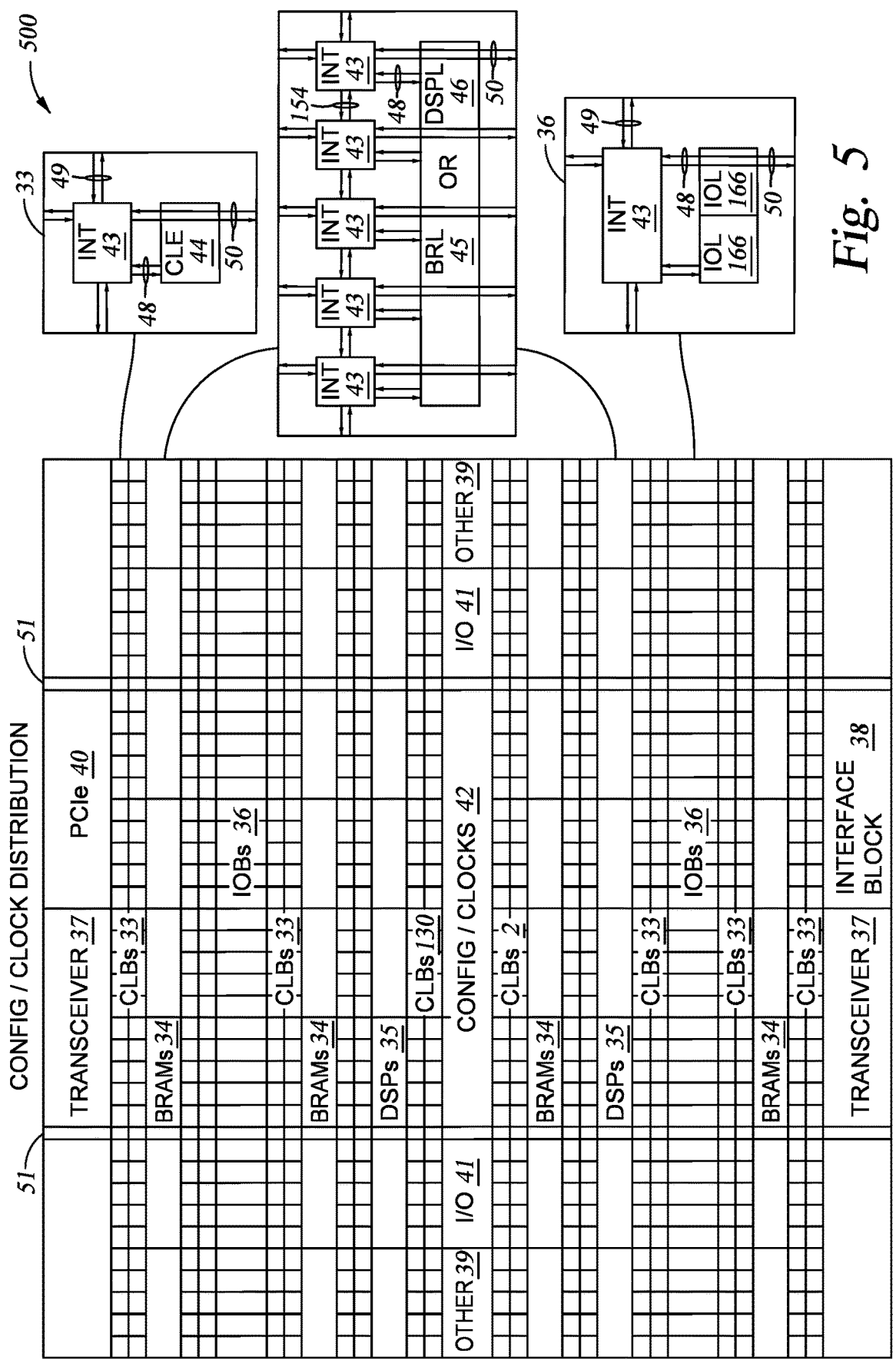
FIG. 5 illustrates a field programmable gate array (FPGA) that can be used for doubling performance of the PHY layers, according to some examples.

FIG. 5 illustrates an example of an FPGA 500. The FPGA 500 can be used as the integrated circuit 101 or 102 of FIG. 1, the integrated circuit 200 of FIG. 2, or the integrated circuit 300 of FIG. 3. The FPGA 500 includes a programmable fabric that includes a large number of different programmable tiles including multi-gigabit transceivers ("MGTs") 37, configurable logic blocks ("CLBs") 2, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39 such as digital clock managers, analog-to-digital converters, system monitoring logic, and so forth. Some FPGAs also include dedicated processor blocks ("PROC").

In some FPGAs, each programmable tile can include at least one programmable interconnect element ("INT") 43 having connections to input and output terminals 48 of a programmable logic element within the same tile. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA. Each programmable interconnect element 43 can include an interconnect circuit that can implement various types of switching among input interconnect segments and output interconnect segments, such as cross-point switching, breakpoint switching, multiplexed switching, and the like.

In an example, a CLB 2 can include a configurable logic element ("CLE") 44 that can be programmed to implement user logic plus a single programmable interconnect element ("INT") 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An 10B 36 can include, for example, two instances of an input/output logic element ("IOL") 166 in addition to one instance of the programmable interconnect element 43. As will be clear to those of skill in the art, the actual I/O pads connected, for example, to the I/O logic element 166 typically are not confined to the area of the input/output logic element 166.

In the pictured example, a horizontal area near the center of the die is used for configuration, clock, and other control logic. Vertical columns 51 extending from this horizontal area or column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, processor block spans several columns of CLBs and BRAMs. The processor block can comprise various components ranging from a single microprocessor to a complete programmable processing system of microprocessor(s), memory controllers, peripherals, and the like.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA. Moreover, the FPGA of FIG. 5 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

The various examples described herein may employ various computer-implemented operations involving data stored in computer systems. For example, these operations may require physical manipulation of physical quantities usually, though not necessarily, these quantities may take the form of electrical or magnetic signals, where they or representations of them are capable of being stored, transferred, combined, compared, or otherwise manipulated. Further, such manipulations are often referred to in terms, such as producing, identifying, determining, or comparing. Any operations described herein that form part of one or more examples may be implemented as useful machine operations. In addition, one or more examples also relate to a device or an apparatus for performing these operations. The apparatus may be specially constructed for specific purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations.

The various examples described herein may be practiced with other computer system configurations including handheld devices, microprocessor systems, microprocessor-based or programmable consumer electronics, minicomputers, mainframe computers, and the like.

One or more examples may be implemented as one or more computer programs or as one or more computer program modules embodied in one or more computer readable media. The term computer readable medium refers to any data storage device that can store data which can thereafter be input to a computer system. A computer readable media may be based on any existing or subsequently developed technology for embodying computer programs in a manner that enables them to be read by a computer. Examples of a computer readable medium (e.g., a non-transitory storage medium) include a hard drive, a Solid State Disk (SSD), network attached storage (NAS), read-only memory, random-access memory (e.g., a flash memory device), a CD (Compact Discs) CD-ROM, a CD-R or a CD-RW, a DVD (Digital Versatile Disc), a magnetic tape, and other optical and non-optical data storage devices. The computer readable medium can also be distributed over a network coupled computer system so that the computer readable code is stored and executed in a distributed fashion.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

While the foregoing is directed to specific examples, other and further examples may be devised without departing from the basic scope thereof, and the scope thereof is determined by the claims that follow.

What is claimed is:

1. An integrated circuit, comprising:
a clock multiplier configured to multiply a frequency of a clock signal from physical (PHY) layers to match a frequency of a clock signal for a communications controller, wherein the frequency of the clock signal from the PHY layers is less than the frequency of the clock signal of the communications controller and a multiplied clock signal is selectively provided to the communications controller;
a first clock divider configured to divide a frequency of the multiplied clock signal and to output a divided clock signal to the communications controller; and
a phase alignment circuit configured to align phases of one or more data signals transmitted by the PHY layers based on a phase of the clock signal from the PHY layers and a phase of the multiplied clock signal.

2. The integrated circuit of claim 1, wherein the first clock divider is configured to divide the frequency of the multiplied clock signal based on a factor indicated in configuration signals.

3. The integrated circuit of claim 1, further comprising: support circuitry for selecting one of the clock signal and the multiplied clock signal to output to the communications controller; and
the support circuitry comprises at least of: one or more AND gates and one or more multiplexers.

4. The integrated circuit of claim 3, wherein the one or more multiplexers are configured to select the clock signal from the PHY layers or the multiplied clock signal based on configuration signals coupled to the multiplexers.

5. The integrated circuit of claim 1, further comprising a second clock divider configured to divide the frequency of the clock signal from the one or more PHY layers.

6. The integrated circuit of claim 5, wherein the second clock divider is configured to divide the frequency of the clock signal from the one or more PHY layers based on configuration information associated to the multiplied clock signal.

7. The integrated circuit of claim 5, wherein the phase alignment circuit determines a phase alignment of the divided clock signal from the first clock divider and a phase of the divided clock signal from the second clock divider.

8. The integrated circuit of claim 7, wherein the phase alignment circuit is configured to:
receive one or more data signals from the one or more PHY layers;
correct a phase of the one or more data signals based on the phase alignment; and
transmit the phase-corrected one or more data signals to the one or more PHY layers.

9. The integrated circuit of claim 7, wherein the phase alignment circuit is configured to:
receive one or more data signals from the communications controller;
correct a phase of the one or more data signals based on the phase alignment; and
transmit the phase-corrected one or more data signals to the communications controller.

10. The integrated circuit of claim 7, wherein the phase alignment circuit is configured to implement a first-in-first-out queue for the divided clock signal from the first clock divider and the divided clock signal from the second clock divider.

11. The integrated circuit of claim 5, wherein the second clock divider is configured to output the divided clock signal to the one or more PHY layers.

12. The integrated circuit of claim 1, wherein the first clock divider is configured to generate a reference clock signal for dividing the multiplied clock signal.

13. The integrated circuit of claim 1, wherein the PHY layers is configured to supply the clock signal to the clock multiplier.

14. The integrated circuit of claim 13, wherein one of the PHY layers is configured to use clocking and phase aligning of another of the PHY layers.

15. The integrated circuit of claim 1, wherein the clock multiplier is configured to receive configuration information associated to the multiplied clock signal.

16. A method for synchronizing a plurality of physical (PHY) layers with a communication controller, the method comprising:
receiving a clock signal from the plurality of PHY layers, wherein a frequency of the clock signal from the plurality of PHY layers does not match a frequency of a clock signal of the communication controller;
multiplying the frequency of the clock signal from the plurality of PHY layers to match the frequency of the clock signal of communication controller; and
aligning a phase of one or more data signals between the one or more PHY layers and the communication controller based on the multiplied clock signal and the clock signal from the plurality of PHY layers.

17. The method of claim 16, wherein aligning the phase of the one or more data signals comprises:
dividing a frequency of the multiplied clock signal based on a first factor indicated in one or more configuration signals into a first divided clock signal;
dividing the frequency of the clock signal from the plurality of PHY layers based on a second factor indicated in the one or more configuration signals into a second divided clock signal;
determining a phase alignment between the first divided clock signal and the second divided clock signal to align the phase of the one or more data signals.

18. The method of claim 16, further comprising: dividing the frequency of the clock signal from the plurality of PHY layers based on a factor indicated by one or more configuration signals, and sending the divided clock signal to the plurality of PHY layers.

19. The method of claim 16, wherein multiplying the frequency of the clock signal from the plurality of PHY layers to match the frequency of the clock signal from the communication controller comprises multiplying the frequency of the clock signal from the plurality of PHY layers by a factor indicated in one or more configuration signals to match the frequency of the clock signal from the plurality of PHY layers with the frequency of the clock signal from the communications controller.

20. An integrated circuit, comprising:
a plurality of physical (PHY) layers, each having a first clock signal with a first frequency and having a first plurality of channels;
a communications controller having a second clock signal with a second frequency and having a second plurality of channels, wherein the second frequency of the second clock signal is greater than the first frequency of the first clock signal and a total number of channels of the plurality of PHY layers matches the second plurality of channels; and a clock multiplier configured to multiply the first frequency of the first clock signal to match the second frequency of the second clock signal to emulate a faster clock communication link between the plurality of PHY layers and the communications controller.

* * * * *